(12) United States Patent
Binnard (10) Patent No.: US 8,492,934 B2
(45) Date of Patent: Jul. 23, 2013

(54) COIL VARIATIONS FOR AN OVAL COIL PLANAR MOTOR

(75) Inventor: Michael B. Binnard, Belmont, CA (US)

(73) Assignee: Nikon Corporation, Tokyo (JP)

( * ) Notice: Subject to any disclaimer, the term of this patent is extended or adjusted under 35 U.S.C. 154(b) by 577 days.

(21) Appl. No.: 12/728,196

(22) Filed: Mar. 20, 2010

(65) Prior Publication Data

US 2010/0238425 A1 Sep. 23, 2010

Related U.S. Application Data

(60) Provisional application No. 61/162,397, filed on Mar. 23, 2009.

(51) Int. Cl.
*H02K 41/035* (2006.01)
(52) U.S. Cl.
USPC .................. 310/12.05; 310/12.21; 355/72
(58) Field of Classification Search
USPC .......... 310/12.04–12.06, 12.21, 12.22, 12.25, 310/12.26, 24; 355/72, 75
See application file for complete search history.

(56) References Cited

U.S. PATENT DOCUMENTS

| | | | |
|---|---|---|---|
| 6,208,045 B1 * | 3/2001 | Hazelton et al. | 310/12.06 |
| 6,445,093 B1 * | 9/2002 | Binnard | 310/12.06 |
| 6,452,292 B1 * | 9/2002 | Binnard | 310/12.06 |
| 6,646,721 B2 * | 11/2003 | Compter et al. | 355/72 |
| 6,847,134 B2 * | 1/2005 | Frissen et al. | 310/12.05 |
| 6,879,063 B2 * | 4/2005 | Frissen et al. | 310/12.05 |
| 6,998,737 B2 | 2/2006 | De Weerdt | |
| 7,388,307 B2 * | 6/2008 | Emoto | 310/12.06 |
| 7,948,122 B2 * | 5/2011 | Compter et al. | 310/12.06 |
| 2008/0024741 A1 | 1/2008 | Butler et al. | |
| 2008/0203828 A1 * | 8/2008 | Compter et al. | 310/12 |

OTHER PUBLICATIONS

Jansen et al., "Moving-Magnet Planar Actuator with Integrated Active Magnetic Bearing", Department of Electrical Engineering, Eindhoven University of Technology Eindhoven, the Netherlands, 4 pages, 2006.
Lierop, "Magnetically Levitated Planar Actuator with Moving Magnets: Dynamics, Commutation and Control Design", CIP—Data Library Technische Universiteit Eindhoven, 125 pages, Copyright 2008.
Jansen, "Magnetically Levitated Planar Actuator with Moving Magnets: Electromechanical Analysis and Design", CIP—Data Library Technische Universiteit Eindhoven, 179 pages, Copyright 2007.

* cited by examiner

*Primary Examiner* — Tran Nguyen
*Assistant Examiner* — Naishadh Desai (57) ABSTRACT

Methods and apparatus for providing an efficient oval coil planar motor are disclosed. According to one aspect of the present invention, an electromagnetic actuator includes at least a first coil group, at least a second coil group, and a magnet array. The first coil group includes at least a first coil that is of an elongated toroidal shape. The first coil has a first coil length and a first coil width that is approximately equal to a multiple of three times the first coil width. The second coil group includes at least a second coil that is of an elongated toroidal shape. The second coil has a second coil width and a second coil length that is approximately equal to a multiple of three times the second coil width. The second coil group is approximately adjacent to the first coil group. The magnet array is configured to cooperate with the first and second coil groups, and includes a plurality of magnets. The magnets have an associated magnet pitch, and the first coil width and the second coil width are a function of the magnet pitch.

33 Claims, 10 Drawing Sheets

COIL VARIATIONS FOR AN OVAL COIL PLANAR MOTOR

CROSS-REFERENCE TO RELATED APPLICATION

The instant application claims priority of U.S. Provisional Patent Application No. 61/162,397, filed Mar. 23, 2009, entitled "Coil Variations for 45 Degree Flatcoil Planar Motor," which is incorporated herein by reference in its entirety.

BACKGROUND OF THE INVENTION

1. Field of the Invention

The present invention relates generally to electromagnetic actuators. More particularly, the present invention relates to coil designs which improve performance of planar motors with flat oval-shaped coils.

2. Description of the Related Art

In many systems which use motors, space is an issue. For example, space may effectively be at a premium in an apparatus which is used to perform lithography. When there are space constraints, motors which have a relatively small footprint, and/or a relatively low profile, are sometimes used to provide movement in two directions. Planar motors generally have relatively small footprints, as well as relatively low profiles.

Flat oval-shaped coils, referred to herein as a "flatcoil" design, may be used in some planar motors. While flatcoil planar motors may operate relatively efficiently, increasing the efficiency with which flatcoil planar motors may operate is generally desirable. As the efficiency associated with a flatcoil planar motor increases, the costs associated with processes, e.g., lithography processes, performed using the flatcoil planar motor may be reduced.

SUMMARY OF THE INVENTION

The present invention pertains to a flatcoil planar motor with relatively high efficiency.

According to one aspect of the present invention, an electromagnetic actuator includes at least a first coil group, at least a second coil group, and a magnet array. The first coil group includes at least a first coil that is of an elongated toroidal shape. The first coil has a first coil length and a first coil width that is approximately equal to a multiple of three times the first coil width. The second coil group includes at least a second coil that is of an elongated toroidal shape. The second coil haw a second coil length and a second coil width that is approximately equal to a multiple of three times the second coil width. The second coil group is approximately adjacent to the first coil group. The magnet array is configured to cooperate with the first and second coil groups, and magnet array includes a plurality of magnets. The magnets have an associated magnet pitch, and the first coil width and the second coil width are a function of the magnet pitch.

In accordance with another embodiment of the present invention, an apparatus includes a stage and a flatcoil planar motor that is coupled to the stage and arranged to cause the stage to move. The flatcoil planar motor includes at least a first group and a second group. The first group and the second group have a shared set of axes. The flatcoil planar motor also includes a magnet array oriented at approximately forty-five degrees to the axes. The first group includes at least a first coil having a first width and a first end-to-end coil length that is approximately equal to an integer multiple of three times the first width. The second group includes at least a second coil having a second width and a second end-to-end coil length that is approximately equal to an integer multiple of three times the second width.

According to still another aspect of the present invention, a flatcoil planar motor includes a first coil group, a second coil group, and a magnet array. The first coil group includes at least a first coil having an elongated toroidal shape. The first coil has a first coil length, a first overall coil width, and a first coil side width. The first coil length is approximately equal to an integer multiple of three times the first overall coil width, and the first coil side width is approximately equal to two-fifths of the first overall coil width. The second coil group includes at least a second coil having an elongated toroidal shape, a second coil length, a second overall coil width, and a second coil side width. The second coil length is approximately equal to an integer multiple of three times the second overall coil width. The second coil side width is approximately equal to two-fifths of the second overall coil width. The first coil group and the second coil group having a shared set of axes. The magnet array cooperates with the first coil group and the second coil group to generate at least one force, and is oriented at approximately forty-five degrees to the shared set of axes.

In one embodiment, the first and second overall coil widths are approximately equal to three hundred degrees as measured on coil coordinates. In another embodiment, the magnet array magnets are arranged in a checkerboard configuration.

Other aspects of the present invention will become apparent from the following detailed description taken in conjunction with the accompanying drawings which illustrate, by way of example, the principles of some embodiments of the present invention.

BRIEF DESCRIPTION OF THE DRAWINGS

The invention will be readily understood by the following detailed description in conjunction with the accompanying drawings, in which.

DETAILED DESCRIPTION OF THE INVENTION

Example embodiments of the present invention are discussed below with reference to the various figures. However, those skilled in the art will readily appreciate that the detailed description given herein with respect to these figures is for explanatory purposes, as the invention extends beyond these embodiments.

Some planar motor designs result in the generation of undesirable side forces. To reduce the overall effect of side forces, dimensions of coils included in a planar motor may be adjusted. Adjusting the dimensions of coils in a planar motor may effectively allow the side forces from each coil to be cancelled out, thus resulting in approximately zero overall side force. Hence, the performance of the planar motor may be improved.

The performance of a planar motor may also be improved by adjusting the spacing between adjacent coils in a planar motor. For example, substantially minimizing the space between adjacent coils may improve the efficiency of the planar motor.

Figure 1A:
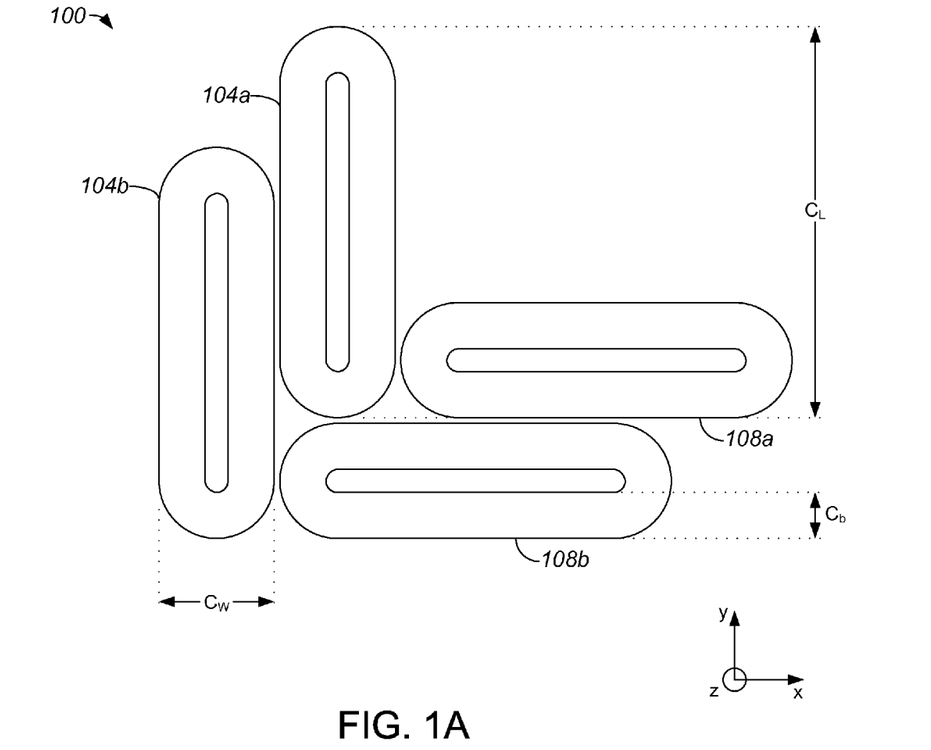
FIG. 1A is a diagrammatic top view representation of a coil group in a flatcoil planar motor in accordance with an embodiment of the present invention.
Figure 1B:
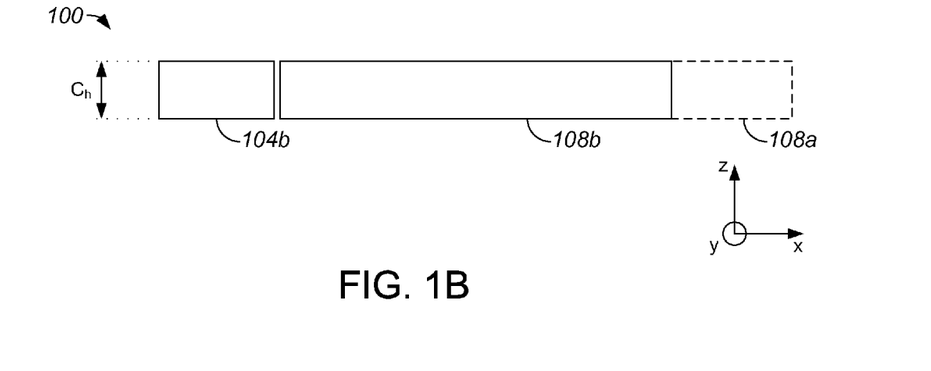
FIG. 1B is a diagrammatic side view representation of a coil group, e.g., coil group 100 of FIG. 1A, in accordance with an embodiment of the present invention.

In one embodiment, a flatcoil planar motor in which the flatcoils are arranged in an approximately forty five degree orientation relative to the orientation of a magnet array may be configured such that the lengths of the flatcoils and the spacing between the flatcoils are selected to provide a desired level of efficiency. Coils in a flatcoil planar motor may be arranged in a variety of different orientations. One orientation in which coils may be arranged is a "herringbone" orientation. Referring initially to FIGS. 1A and 1B, one example of a coil group in a flatcoil planar motor will be described in accordance with an embodiment of the present invention. A coil group 100 is shown from a top view in FIG. 1A, and from a side view in FIG. 1B. Coil group 100 includes a plurality of flatcoils 104a, 104b and a plurality of flatcoils 108a, 108b oriented in a substantially herringbone orientation. The herringbone orientation is such that a side of flatcoil 108a is aligned with an end of flatcoil 104b along an x-direction, and a side of flatcoil 108b is aligned with an end of flatcoil 104 along the x-direction. In general, it should be appreciated that coil group 100 may generally include any number of flatcoils 104a, 104b and flatcoils 108a, 108b. However, for ease of illustration and discussion, two flatcoils 104a, 104b and two flatcoils 108a, 108b are shown.

Flatcoils 104a, 104b and flatcoils 108a, 108b, in the described embodiment, are effectively "racetrack" shaped. That is, flatcoils 104a, 104b and flatcoils 108a, 108b may be shaped as toroids such as elongated toroids, and may have an approximately rectangularly-shaped, e.g., square shaped, cross-sections. The shape of flatcoils 104a, 104b and flatcoils 108a, 108b is not limited, however, to being substantially racetrack shaped.

Each flatcoil 104a, 104b, 108a, 108b has a coil length $C_L$, a coil width $C_W$, a coil side width $C_b$, and a coil height $C_h$. Coil length $C_L$ is measured substantially between opposing ends of each flatcoil, as shown. That is, coil length $C_L$ is effectively an end-to-end measurement of a flatcoil, e.g., flatcoil 104a. Coil width $C_W$ is measured substantially between opposing sides of each flatcoil, and is effectively the overall width of each flatcoil. Coil side width $C_b$ is the width of a leg of each flatcoil. In other words, coil side width $C_b$ is the width associated with the length of each flatcoil, as measured from an inner surface of the flatcoil to an outer surface of the flatcoil, as shown. Coil height $C_h$ is a height or thickness of each flatcoil. It should be appreciated that although each flatcoil 104a, 104b, 108a, 108b is shown as having approximately the same coil length $C_L$, coil width $C_W$, coil side width $C_b$, and coil height $C_h$, the coil length $C_L$, coil width $C_W$, coil side width $C_b$, and coil height $C_h$, may instead differ for each flatcoil.

Figure 2:
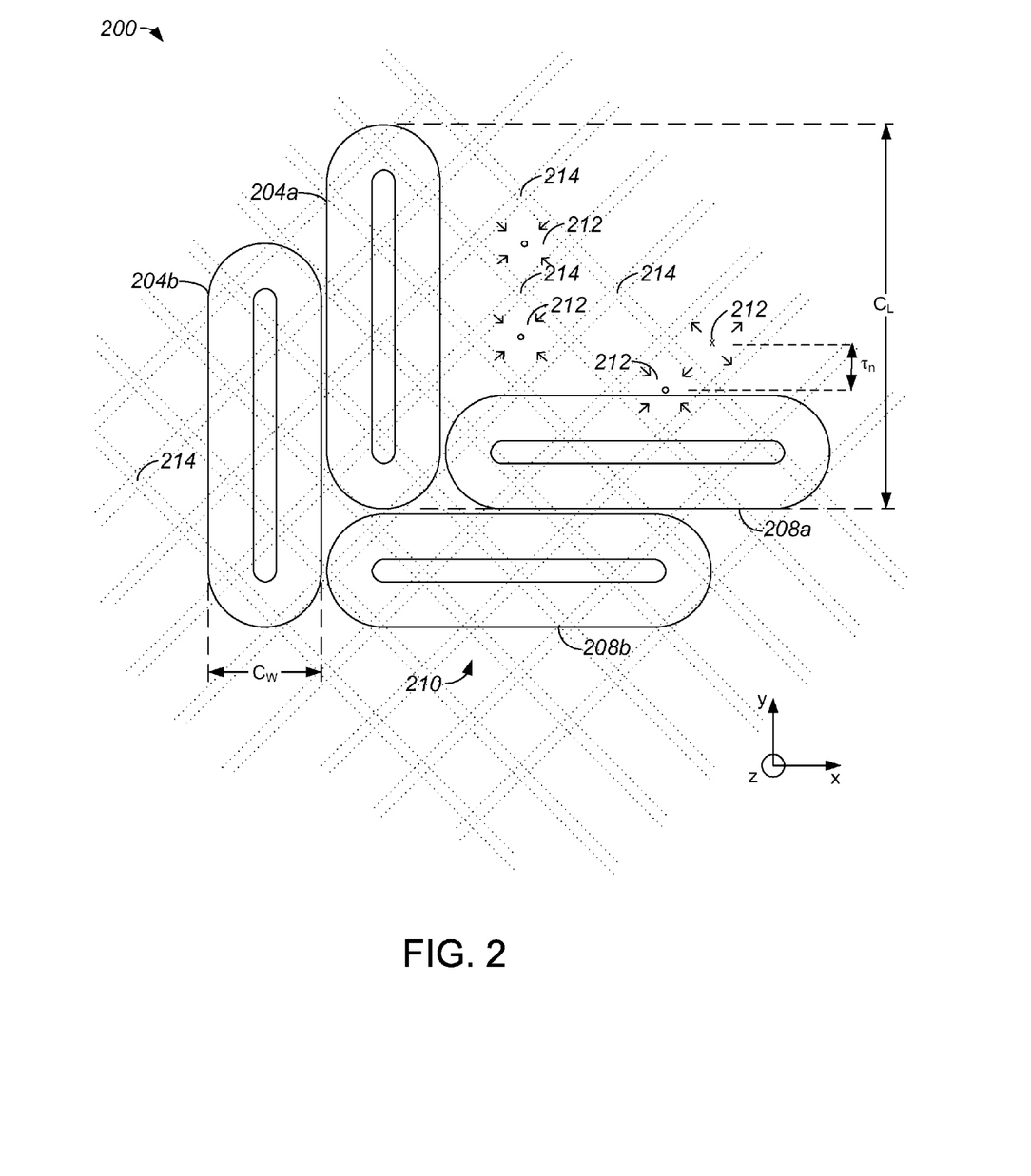
FIG. 2 is a diagrammatic representation of coil groups and a magnet array that are a part of a flatcoil planar motor in accordance with an embodiment of the present invention.

Within a planar motor that includes flatcoils such as flatcoils 104a, 104b, 108a, 108b, a magnet array generally cooperate with the flatcoil to allow the planar motor to operate. In one embodiment, the magnet array may be a checkerboard magnet array that is oriented at approximately forty five degrees to the axes of flatcoils 104a, 104b, 108a, 108b. FIG. 2 is a diagrammatic representation of coil groups and a magnet array that are a part of a flatcoil planar motor, as for example a 3-phase motor, in accordance with an embodiment of the present invention. It should be appreciated that FIG. 2 is shown for purposes of illustration, and that the scale between magnets and coils may vary. In addition, there are typically many more coil groups and coils arranged in a substantially herringbone pattern than shown. Coil groups include coils 204a, 204b and coils 208a, 208b. That is, coils 204a, 204b may be included in one coil group, while coils 208a, 208b may be included in another coil group. Coils 204a, 204b and coils 208a, 208b are arranged in a herringbone pattern, as shown, and cooperate with a magnet array 210 to generate forces suitable for providing planar motion.

Magnet array 210 includes magnets 212 oriented at approximately forty five degrees to axes of coils 204a, 204b and coils 208a, 208b. Magnets 212 may be substantially separated by filling material 214, which may be additional magnet material, epoxy, aluminum, and/or another non-magnetic material. Alternatively, filling material 214 may be air; in other words, the small square spaces indicated by 214 may be left substantially empty. Magnets 212 may have a magnet pitch $\tau_n$. In one embodiment, a coil length $C_L$ may be approximately 720 degrees, as defined by a north-to-north (N-N) magnet pitch measured in coil coordinates. Using coil coordinates, magnet pitch $\tau_n$ may be approximately 180 degrees of a magnetic period. In another embodiment, a coil length $C_L$ may be approximately 360 degrees.

A coil width $C_W$ may be expressed as a function of magnet pitch $\tau_n$, or may otherwise be based at least in part upon magnet pitch $\tau_n$. By way of example, for a magnet pitch $\tau_n$ defined to be approximately 180 degrees of a magnetic period associated with magnet array 210, suitable values for a coil width $C_W$ may be approximately sixty degrees, approximately 300 degrees, approximately 240 degrees, and/or approximately 120 degrees to produce a 3-phase motor. In one embodiment, a coil width $C_W$ may be expressed as approximately an integer multiple of one-third the magnet pitch $\tau_n$. It should be appreciated that coil width $C_W$ of approximately 180 degrees may be possible in applications for which a 2-phase motor is preferred.

A coil length $C_L$ may generally be expressed as a function of a coil width $C_W$. For example, if spacing between adjacent coils, such as between coil 204a and coil 204b, is to be substantially minimized, a coil length $C_L$ may be expressed as $C_L = 3N * C_W$, where N is an integer. That is, an overall coil length $C_L$ may be an integer multiple of approximately three times a coil width $C_W$. Substantially minimizing spacing between coils allows the efficiency associated with the planar motor that includes coils 204a, 204b, 208a, 208b to be substantially maximized. Typically, the overall coil length $C_L$ may be less than, e.g., slightly less than, or approximately equal to three times the coil width $C_W$ when each coil group of a planar motor includes approximately three coils.

Figure 3:
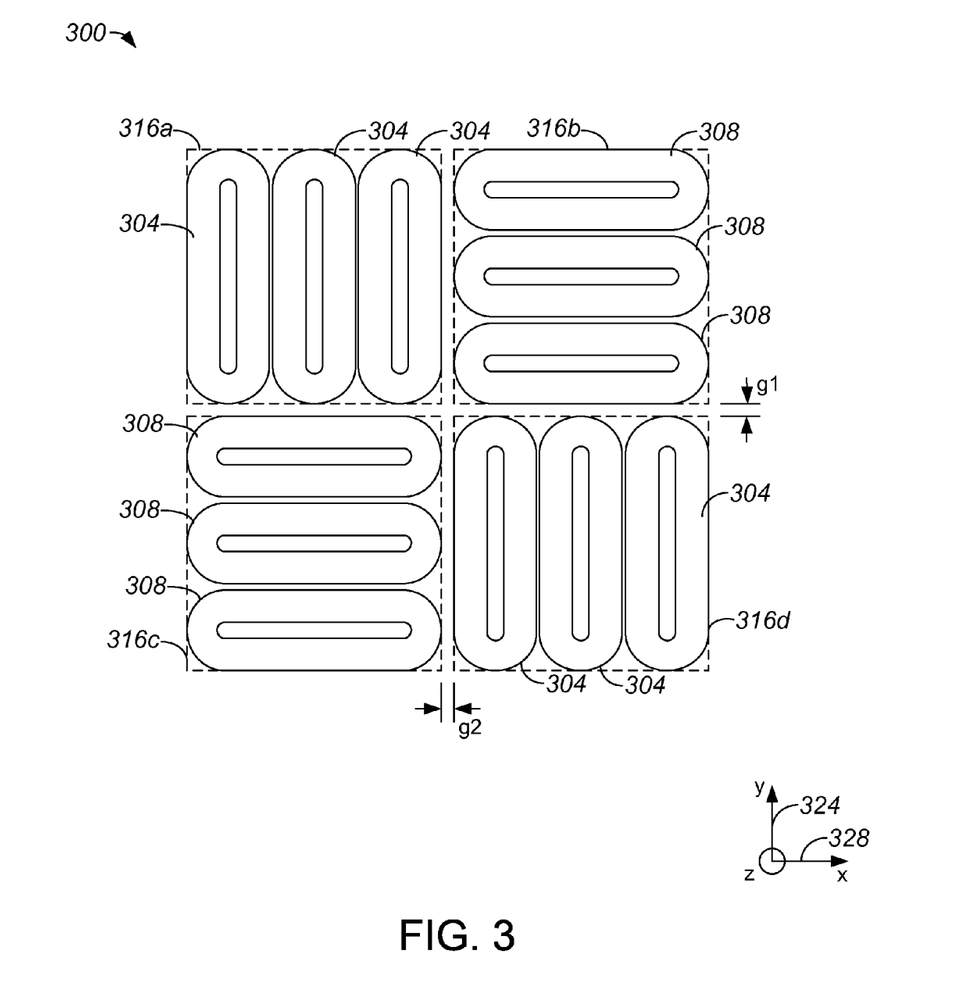
FIG. 3 is a diagrammatic representation of square groups of coils in a flatcoil planar motor in accordance with an embodiment of the present invention.

Rather than being oriented in a herringbone configuration, coils of a flatcoil planar motor may be oriented in a variety of other configurations. For example, coils may be grouped into substantially square groups. FIG. 3 is a diagrammatic representation of square groups of coils in a flatcoil planar motor in accordance with an embodiment of the present invention. A flatcoil planar motor 100 may include multiple square groups 316a-d of flatcoils 304, 308. As shown, square groups 316a, 316d include flatcoils 304 which are arranged with a long axis aligned along a y-axis 320, and square groups 316b, 316c include flatcoils 308 which are arranged with a long axis aligned along an x-axis 328.

In one embodiment, coils 304, 308 each have a length that is approximately equal to three times the width of coils 304, 308. In other words, coils 304, 308 each have an overall side-to-side width, and the length of each coil 304, 308 is approximately equal to three times the overall side-to-side width. As such square groups 316a-d each have a length and a width that is approximately equal to three times the overall side-to-side width of each coil 304, 308.

Adjacent square groups 316a-d are separated, in one embodiment, by a distance. For example, square group 316a may be separated from square group 316b by a distance g2 and from square group 316c by a distance g1, while square group 316d may be separated from square group 316d by distance g1 and from square group 316c by distance g2. Distances g1, g2 are generally measured between ends of coils of one square group and the side of a coil of an adjacent square group. By way of example, distance g1 may be measured from ends of coils 304 in square group 316a to a side of a coil 308 in square group 316c that is nearest to square group 316a. Similarly, distance g2 may be measured from ends of coils 308 in square group 316b to a coil 304 in square group 316a that is nearest to square group 316b.

Generally, distances g1, g2 may vary widely. Distances g1, g2 may be sized, as appropriate, to enable sensors and wiring to be positioned within spaces between adjacent square groups 316a-d. Distances g1, g2 may also be sized as needed to enable coolant to flow between adjacent square groups 316a-d. While distances g1, g2 may be such that adjacent square groups 316a-d are spaced apart by between approximately five millimeters and approximately fifteen millimeters, distances g1, g2 are not limited to being spaced apart by between approximately five millimeters and approximately fifteen millimeters.

It should be appreciated that flatcoil planar motor 300 also includes a magnet array (not shown), e.g., an array of permanent magnets arranged in a checkerboard pattern as shown in FIG. 2. Such a magnet array (not shown) is generally configured such that the magnets of the magnet array are oriented at approximately forty-five degrees to axes 328, 324.

Figure 4:
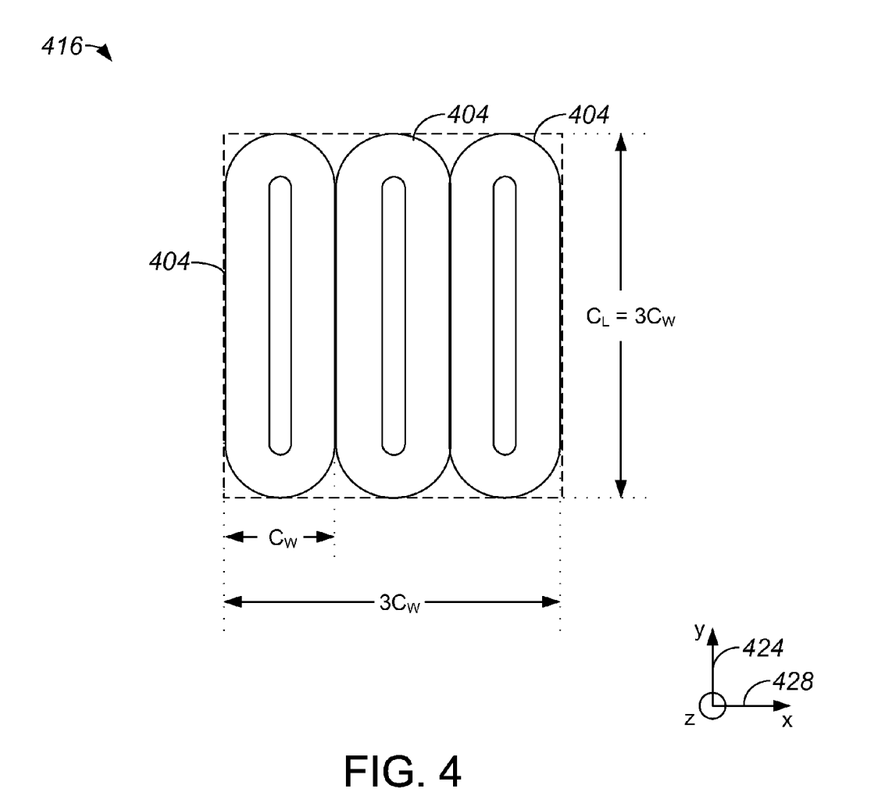
FIG. 4 is a diagrammatic representation of one square coil group of a flatcoil planar motor in accordance with an embodiment of the present invention.

As mentioned above, square coil groups such as square groups 316a-d may have dimensions that are approximately equal to three times the overall width of a flatcoil 304, 308. FIG. 4 is a diagrammatic representation of one square coil group of a flatcoil planar motor in accordance with an embodiment of the present invention. A square coil group 416 include three flatcoils 404, each having approximately the same overall coil width $C_W$. As such, square coil group 416 has a width as measured along an x-axis 428 that is approximately equal to three times the overall coil width $C_W$. It should be appreciated that in some instances, coils 404 may be spaced apart from each other, but any gaps between adjacent coils 404 generally has a size, e.g., width, that is much less than the overall coil width $C_W$.

Coils 404 have a coil length $C_L$ as measured along a y-axis 424 that is approximately equal to three times the overall coil width $C_W$. As such, square coil group 416 has a height and a width that is approximately three times the overall coil width $C_W$. More generally, square coil group 416 has a height and a width that is approximately equal to the number of coils 404 multiplied by the overall coil width $C_W$. Because 3-phase motors are generally preferable in one embodiment, the number of coils in square coil group 416 is preferably an integer multiple of three.

Figure 5:
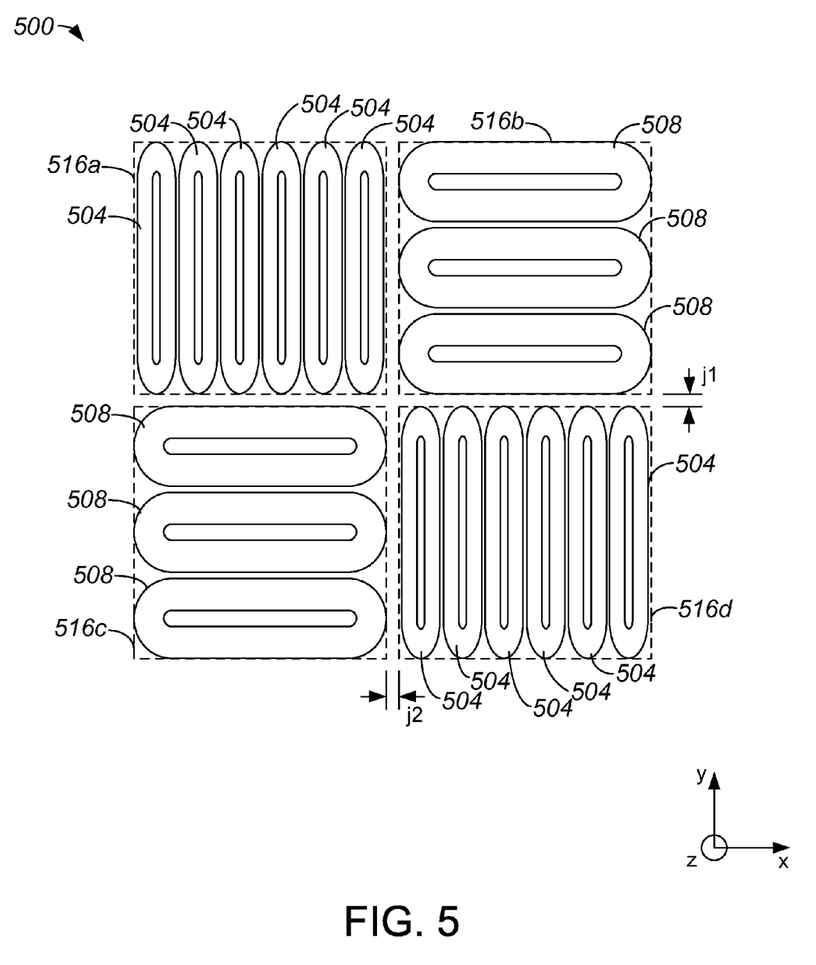
FIG. 5 is a diagrammatic representation of square groups of coils in a flatcoil planar motor in which different groups have a different number of coils in accordance with an embodiment of the present invention.

While maintaining the same number of coils in each coil group of a flatcoil planar motor is generally preferred, square coil groups may include different numbers of coils. Referring next to FIG. 5, a flatcoil planar motor that includes groups of coils having a differing numbers of coils will be described in accordance with an embodiment of the present invention. A flatcoil planar motor 500 includes groups of coils 516a-d which are approximately square in shape. Groups of coils 516a-d are spaced apart from each other by gap distances j1, j2, as shown.

Groups 516b, 516c include three coils 508 each, while groups 516a, 516d include six coils 504 each. Coils 508 of groups 516b, 516c and coils 504 of groups 516a, 516d are shown as being spaced apart by gap distances. It should be appreciated that the gap distances between adjacent coils 508 of groups 516b, 516c and between adjacent coils 504 of groups 516a, 516d have been exaggerated for purposes of illustration.

Coils 504, 508 may have approximately the same length. The widths of coils 504, 508, in the described embodiment, vary. Coils 504 may each have an overall coil width that is approximately equal to half of the overall coil width of coils 508. Alternatively, coils 504 may have approximately the same coil width as coils 508, and coil groups 516a and 516b may be approximately rectangular, e.g., twice as wide in an x-direction as they are in a y-direction, rather than being substantially square.

Figure 6:
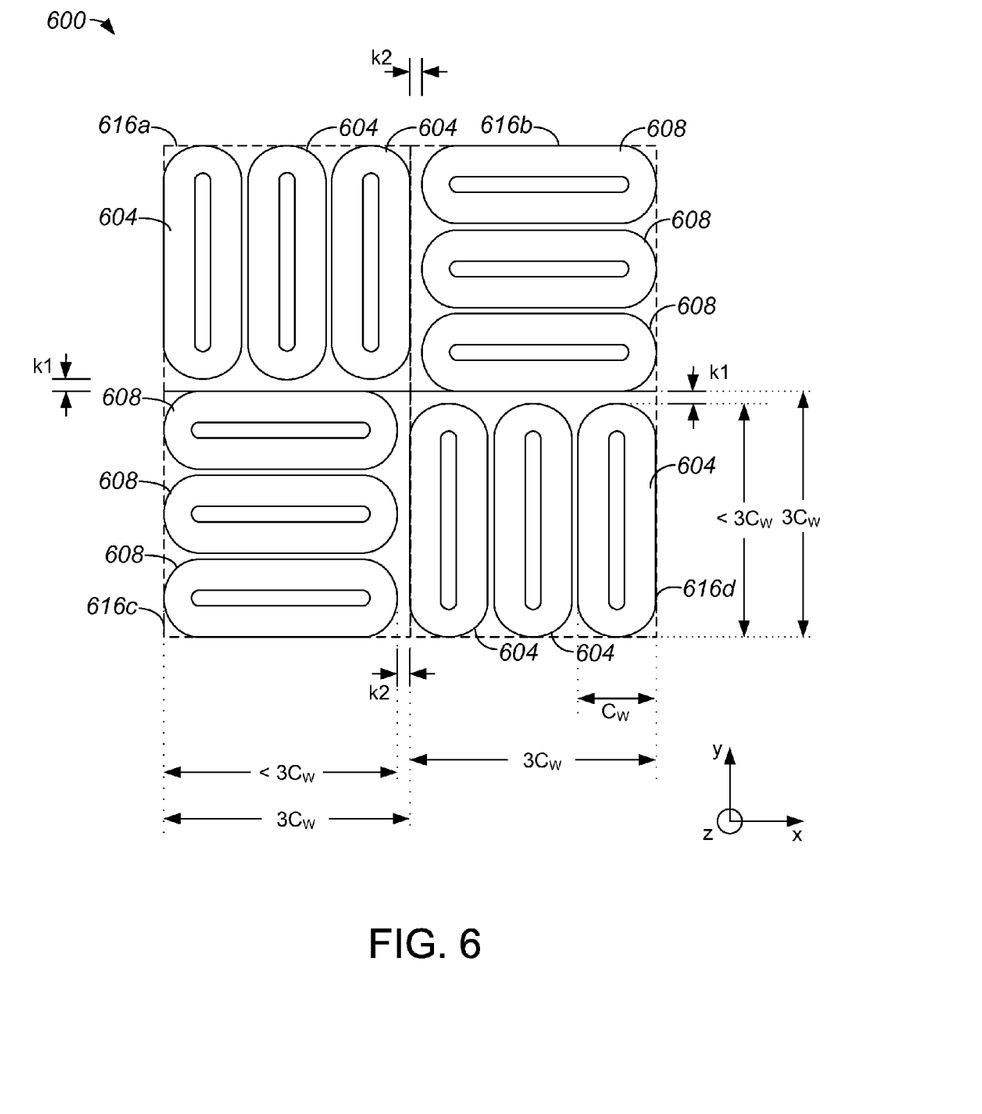
FIG. 6 is a diagrammatic representation of square groups of coils of a flatcoil planar motor in which the length of the coils is less than three times the width of the coils in accordance with an embodiment of the present invention.

Shortening the length of coils to slightly less than the number of coils in a coil group multiplied by the overall width of each coil may allow for cooling space between adjacent groups of coils. For example, the length of coils in a square coil group which includes three coils may be shortened to be less than three times the width of the coils may allow. FIG. 6 is a diagrammatic representation of square groups of coils of a flatcoil planar motor in which the length of the coils is less than three times the width of the coils in accordance with an embodiment of the present invention. A flatcoil planar motor 600 includes square coil groups 616a, 616d which include coils 604 and square coil groups 616b, 616c which include coils 608.

Coils 604, 608 each have approximately the same overall coil width $C_W$. The lengths of coils 604 may be selected to provide a gap distance k1 at ends of coils 604. By way of example, the lengths of coils 604 may be less than approximately three times the overall coil width $C_W$ such that the length of a coil 604 added to gap distance k1 is approximately equal to three times the overall coil width $C_W$. Similarly, the lengths of coils 608 may be selected to provide a gap distance k2 at ends of coils 604. When lengths of coils 608 is less than approximately three times the overall coil width $C_W$, then the length of a coil 608 added to gap distance k2 may be approximately equal to three times the overall coil width $C_W$. In general, gap distances k1, k2 are much less than three times the overall coil width $C_W$. Alternatively, the length of the coils may be approximately three times the overall coil width $C_W$, and the area circumscribing each coil group and the corresponding gaps may be substantially rectangular shaped. For instance, coil group 616a may define an area that is approximately $3C_W$ on one side and approximately by $3C_W$ added to distance k1 on another side.

Figure 7:
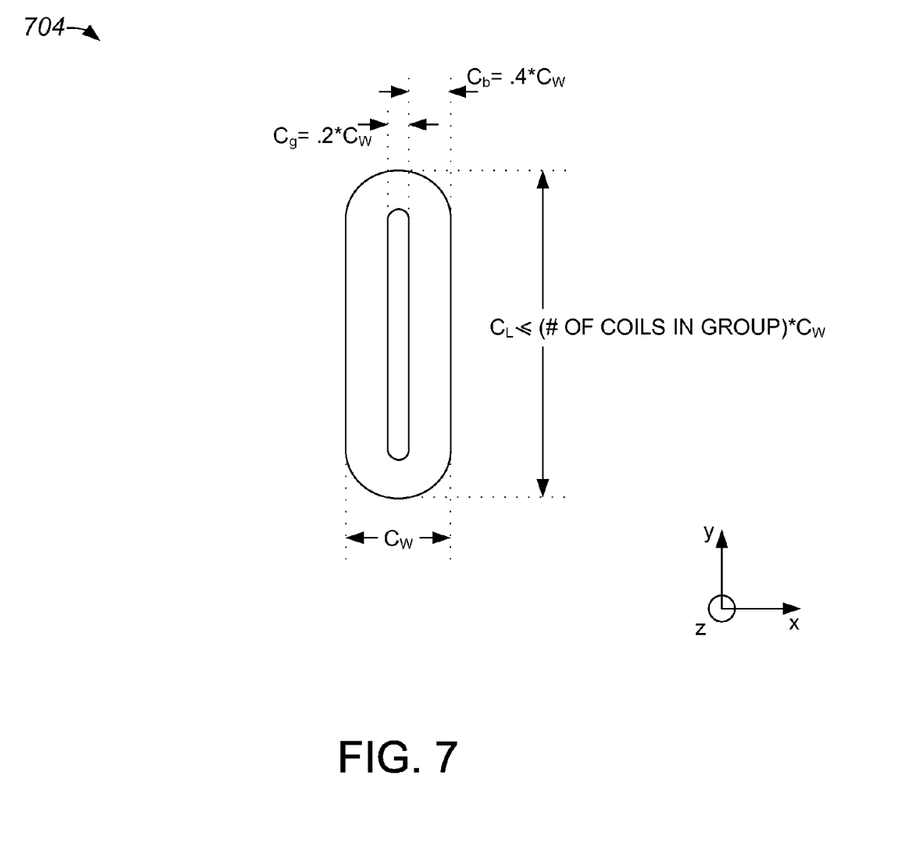
FIG. 7 is a diagrammatic representation of a coil suitable for use in a flatcoil planar motor in accordance with an embodiment of the present invention.

The configuration of a flatcoil used in a flatcoil planar motor may generally vary widely. For example, the dimensions of a torodially shaped flatcoil may vary. With reference to FIG. 7, an example of a coil suitable for use in a flatcoil planar motor will be described in accordance with an embodiment of the present invention. A coil 704 has an overall coil width $C_W$ measured from one side of coil 704 to the opposite side of coil 704. An overall coil length $C_L$ of coil 704 may vary depending upon the requirements of a planar motor of which coil 704 is a part. In general, coil 704 may have a coil length $C_L$ that is approximately equal to or slightly less than the number of coils in a group (not shown) which includes coil 704 multiplied by the coil width $C_W$. For example, if coil 704 is a part of a coil group which includes three coils, then the overall coil length $C_L$ may be approximately equal to three times the overall coil width $C_W$, or slightly less than three times the overall coil width $C_W$. It should be appreciated, however, that in alternative embodiments, coil groups are not substantially square. In other words, coil groups are not limited to being approximately square.

The sides or legs of coil 704 have, in the described embodiment, a coil width $C_b$ of approximately two-fifths of the overall coil width $C_W$. As such, an opening in coil 704, as measured between opposite internal surfaces of the sides of coils, has a width of approximately one-fifth of the overall coil width $C_W$. Although the ends of the opening in coil 704 are illustrated as semicircular arcs, it should be appreciated that the shape of ends of the opening may vary widely. Depending on the specific application, it may be preferable to make the shape of the opening rectangular, or rectangular with slightly rounded corners.

Figure 8:
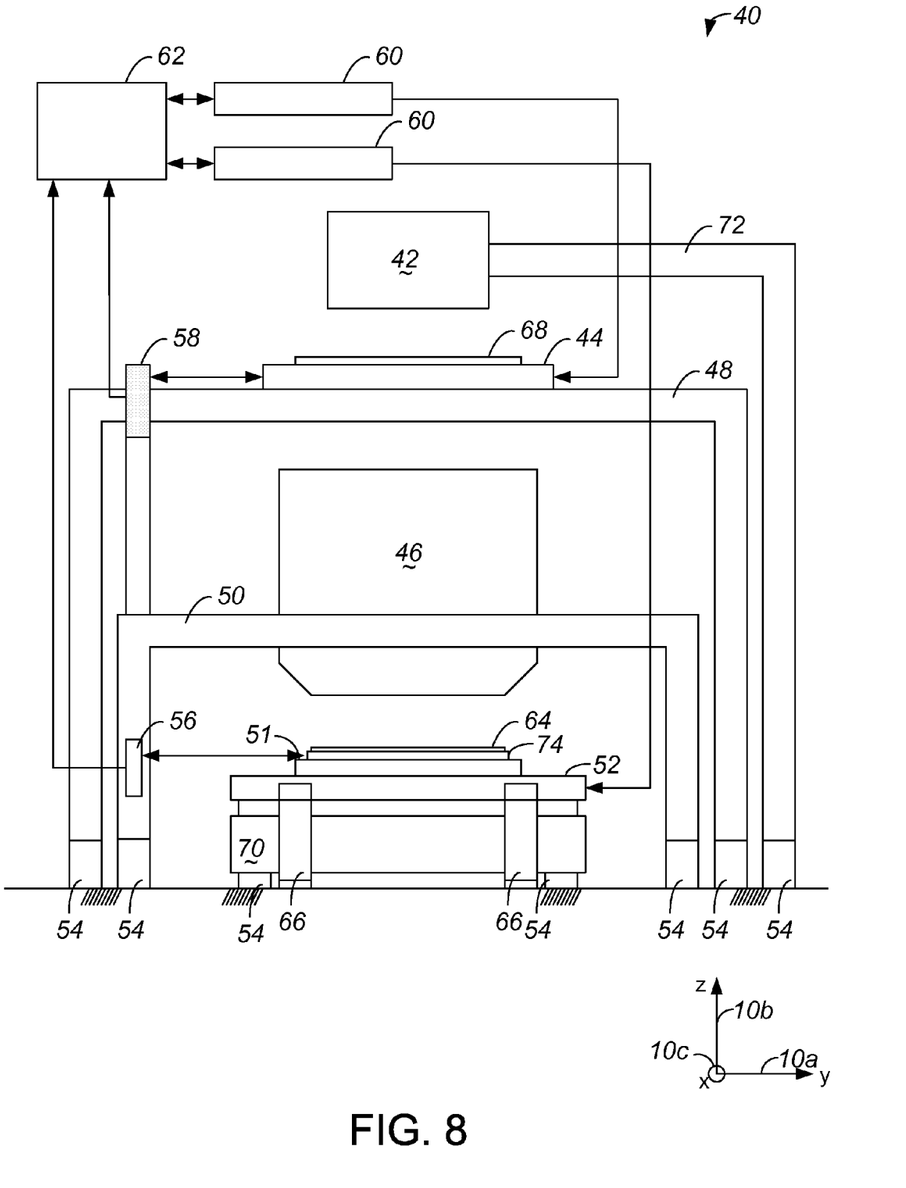
FIG. 8 is a diagrammatic representation of a photolithography apparatus in accordance with an embodiment of the present invention.

With reference to FIG. 8, a photolithography apparatus which may include a flatcoil planar motor will be described in accordance with an embodiment of the present invention. A photolithography apparatus (exposure apparatus) 40 includes a wafer positioning stage 52 that may be driven by a planar motor (not shown), as well as a wafer table 51. The planar motor which drives wafer positioning stage 52 generally uses an electromagnetic force generated by magnets and corresponding armature coils arranged in two dimensions. Such a planar motor may be a flatcoil planar motor, as described above.

A wafer 64 is held in place on a wafer holder or chuck 74 which is coupled to wafer positioning stage 52. Wafer positioning stage 52 is arranged to move in multiple degrees of freedom, e.g., in up to six degrees of freedom, under the control of a control unit 60 and a system controller 62. In one embodiment, wafer positioning stage 52 may include a plurality of actuators and have a configuration as described above. The movement of wafer positioning stage 52 allows wafer 64 to be positioned at a desired position and orientation relative to a projection optical system 46.

The motor array of wafer positioning stage 52 is typically supported by a base 70. Base 70 may be supported to a ground via isolators 54. Reaction forces generated by motion of wafer stage 52 may be mechanically released to a ground surface through a frame 66. One suitable frame 66 is described in JP Hei 8-166475 and U.S. Pat. No. 5,528,118, which are each herein incorporated by reference in their entireties. More preferably, reaction forces generated by motion of wafer positioning stage 52 may be absorbed in a countermass (not shown), which may include the base 70.

An illumination system 42 is supported by a frame 72. Frame 72 is supported to the ground via isolators 54. Illumination system 42 includes an illumination source, which may provide a beam of light that may be partially transmitted through or reflected off of a reticle. In one embodiment, illumination system 42 may be arranged to project a radiant energy, e.g., light, through a mask pattern on a reticle 68 that is supported by and scanned using a reticle stage 44 which may include a coarse stage and a fine stage, or which may be a single, monolithic stage. The radiant energy is focused through projection optical system 46, which is supported on a projection optics frame 50 and may be supported the ground through isolators 54. Suitable isolators 54 include those described in JP Hei 8-330224 and U.S. Pat. No. 5,874,820, which are each incorporated herein by reference in their entireties.

A first interferometer 56 is supported on projection optics frame 50, and functions to detect the position of wafer stage 52. Interferometer 56 outputs information on the position of wafer stage 52 to system controller 62. A second interferometer 58 is supported on projection optics frame 50, and detects the position of reticle stage 44 which supports a reticle 68. Interferometer 58 also outputs position information to system controller 62.

It should be appreciated that there are a number of different types of photolithographic apparatuses or devices. For example, photolithography apparatus 40, or an exposure apparatus, may be used as a scanning type photolithography system which exposes the pattern from reticle 68 onto wafer 64 with reticle 68 and wafer 64 moving substantially synchronously. In a scanning type lithographic device, reticle 68 is moved perpendicularly with respect to an optical axis of a lens assembly (projection optical system 46) or illumination system 42 by reticle stage 44. Wafer 64 is moved perpendicularly to the optical axis of projection optical system 46 by a wafer stage 52.

Alternatively, photolithography apparatus or exposure apparatus 40 may be a step-and-repeat type photolithography system that exposes reticle 68 while reticle 68 and wafer 64 are stationary, i.e., at a substantially constant velocity of approximately zero meters per second. In one step and repeat process, wafer 64 is in a substantially constant position relative to reticle 68 and projection optical system 46 during the exposure of an individual field. Subsequently, between consecutive exposure steps, wafer 64 is consecutively moved by wafer positioning stage 52 perpendicularly to the optical axis of projection optical system 46 and reticle 68 for exposure. Following this process, the images on reticle 68 may be sequentially exposed onto the fields of wafer 64 so that the next field of semiconductor wafer 64 is brought into position relative to illumination system 42, reticle 68, and projection optical system 46.

It should be understood that the use of photolithography apparatus or exposure apparatus 40, as described above, is not limited to being used in a photolithography system for semiconductor manufacturing. For example, photolithography apparatus 40 may be used as a part of a liquid crystal display (LCD) photolithography system that exposes an LCD device pattern onto a glass plate or a photolithography system for manufacturing a thin film magnetic head.

The illumination source of illumination system 42 may be g-line (436 nanometers (nm)), i-line (365 nm), a KrF excimer laser (248 nm), an ArF excimer laser (193 nm), and an F2-type laser (157 nm). Alternatively, illumination system 42 may also use charged particle beams such as x-ray and electron beams. For instance, in the case where an electron beam is used, thermionic emission type lanthanum hexaboride (LaB6) or tantalum (Ta) may be used as an electron gun. Furthermore, in the case where an electron beam is used, the structure may be such that either a mask is used or a pattern may be directly formed on a substrate without the use of a mask.

With respect to projection optical system 46, when far ultra-violet rays such as an excimer laser are used, glass materials such as quartz and fluorite that transmit far ultra-violet rays is preferably used. When either an F2-type laser or an x-ray is used, projection optical system 46 may be either catadioptric or refractive (a reticle may be of a corresponding reflective type), and when an electron beam is used, electron optics may comprise electron lenses and deflectors. As will be appreciated by those skilled in the art, the optical path for the electron beams is generally in a vacuum.

In addition, with an exposure device that employs vacuum ultra-violet (VUV) radiation of a wavelength that is approximately 200 nm or lower, use of a catadioptric type optical system may be considered. Examples of a catadioptric type of optical system include, but are not limited to, those described in Japan Patent Application Disclosure No. 8-171054 published in the Official gazette for Laid-Open Patent Applications and its counterpart U.S. Pat. No. 5,668,672, as well as in Japan Patent Application Disclosure No. 10-20195 and its counterpart U.S. Pat. No. 5,835,275, which are all incorporated herein by reference in their entireties. In these examples, the reflecting optical device may be a catadioptric optical system incorporating a beam splitter and a concave mirror. Japan Patent Application Disclosure (Hei) No. 8-334695 published in the Official gazette for Laid-Open Patent Applications and its counterpart U.S. Pat. No. 5,689,377, as well as Japan Patent Application Disclosure No. 10-3039 and its counterpart U.S. Pat. No. 5,892,117, which are all incorporated herein by reference in their entireties. These examples describe a reflecting-refracting type of optical system that incorporates a concave mirror, but without a beam splitter, and may also be suitable for use with the present invention.

The present invention may be utilized, in one embodiment, in an immersion type exposure apparatus if suitable measures are taken to accommodate a fluid. For example, PCT patent application WO 99/49504, which is incorporated herein by reference in its entirety, describes an exposure apparatus in which a liquid is supplied to a space between a substrate (wafer) and a projection lens system during an exposure process. Aspects of PCT patent application WO 99/49504 may be used to accommodate fluid relative to the present invention.

Figure 9:
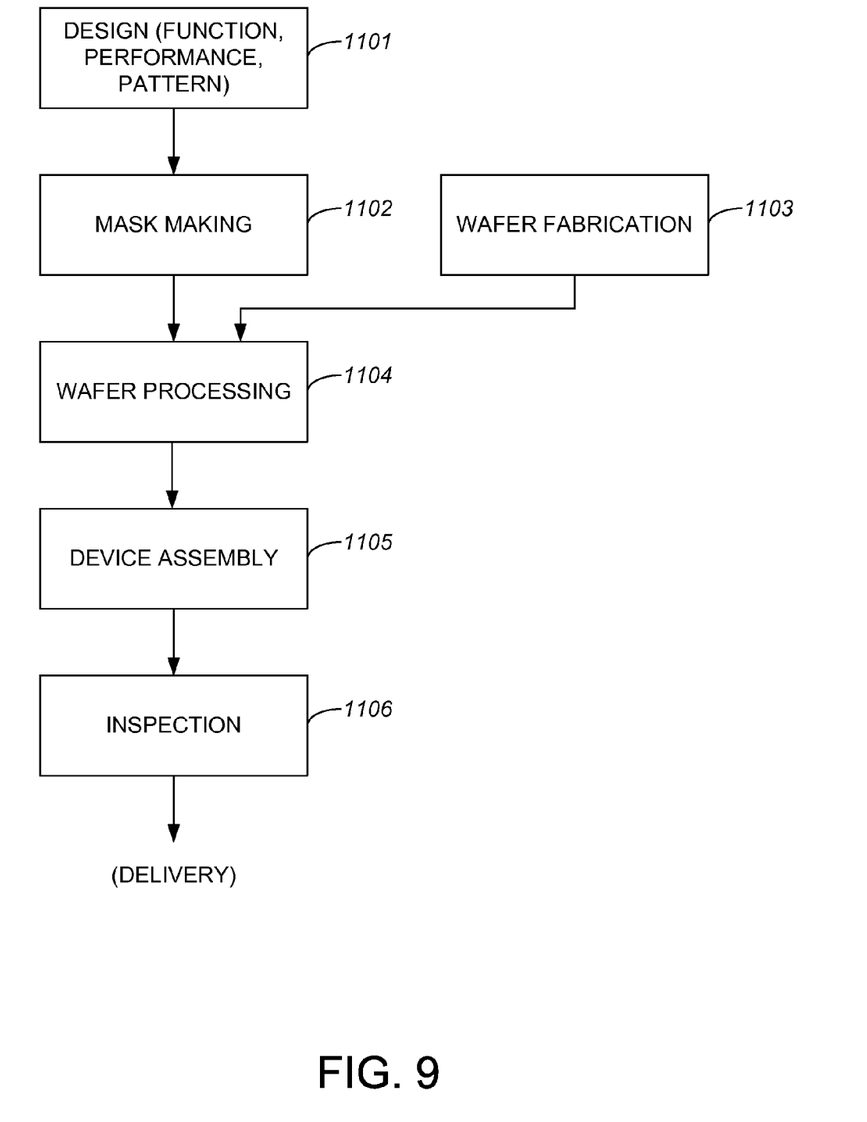
FIG. 9 is a process flow diagram which illustrates the steps associated with fabricating a semiconductor device in accordance with an embodiment of the present invention.

Further, semiconductor devices may be fabricated using systems described above, as will be discussed with reference to FIG. 9. FIG. 9 is a process flow diagram which illustrates the steps associated with fabricating a semiconductor device in accordance with an embodiment of the present invention. A process 1001 of fabricating a semiconductor device begins at step 1003 in which the function and performance characteristics of a semiconductor device are designed or otherwise determined. Next, in step 1005, a reticle or mask in which has a pattern is designed based upon the design of the semiconductor device. It should be appreciated that in a substantially parallel step 1009, a wafer is typically made from a silicon material. In step 1013, the mask pattern designed in step 1005 is exposed onto the wafer fabricated in step 1009. One process of exposing a mask pattern onto a wafer will be described below with respect to FIG. 10. In step 1017, the semiconductor device is assembled. The assembly of the semiconductor device generally includes, but is not limited to including, wafer dicing processes, bonding processes, and packaging processes. Finally, the completed device is inspected in step 1021. Upon successful completion of the inspection in step 1021, the completed device may be considered to be ready for delivery.

Figure 10:
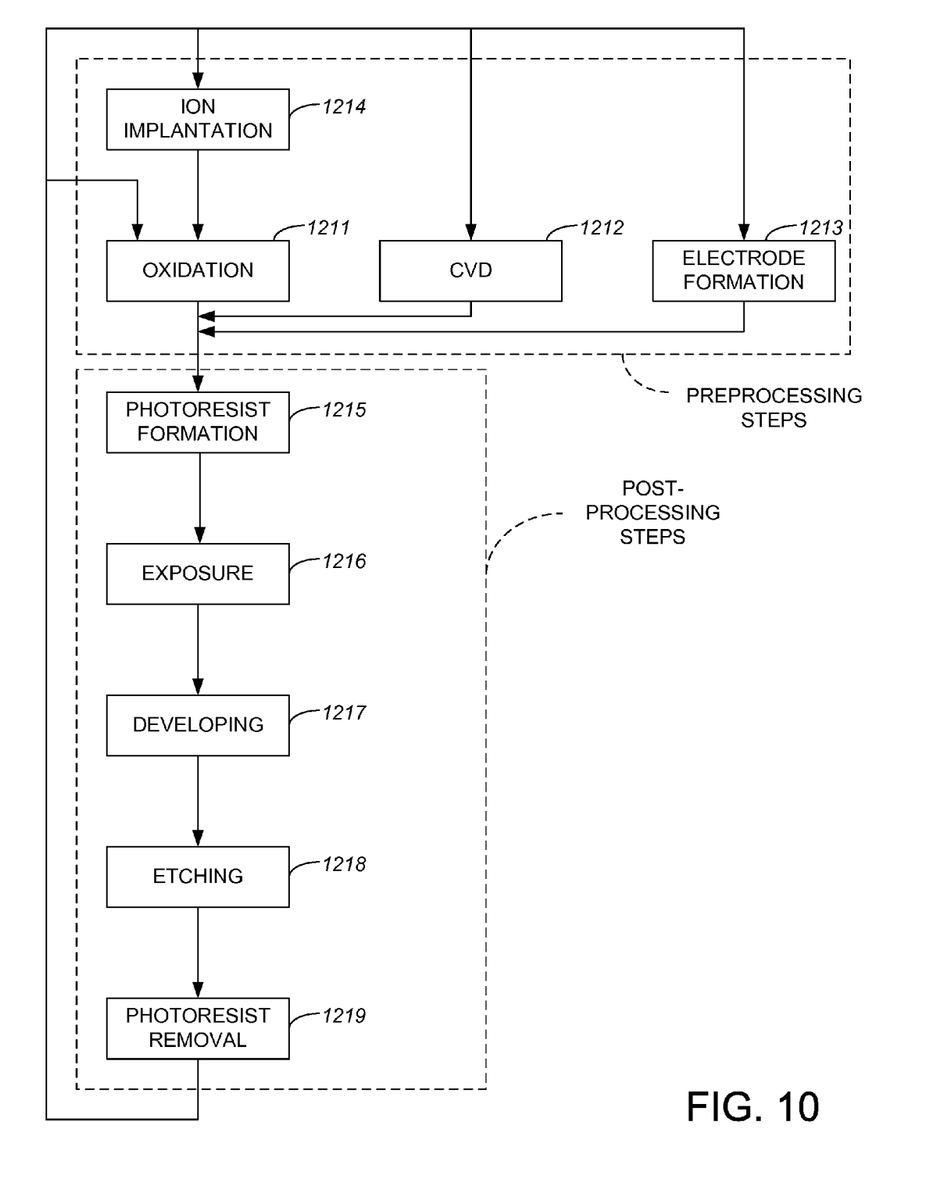
FIG. 10 is a process flow diagram which illustrates the steps associated with processing a wafer, i.e., step 1004 of FIG. 9, in accordance with an embodiment of the present invention.

FIG. 10 is a process flow diagram which illustrates the steps associated with wafer processing in the case of fabricating semiconductor devices in accordance with an embodiment of the present invention. In step 1101, the surface of a wafer is oxidized. Then, in step 1105 which is a chemical vapor deposition (CVD) step in one embodiment, an insulation film may be formed on the wafer surface. Once the insulation film is formed, then in step 1109, electrodes are formed on the wafer by vapor deposition. Then, ions may be implanted in the wafer using substantially any suitable method in step 1113. As will be appreciated by those skilled in the art, steps 1101-1113 are generally considered to be preprocessing steps for wafers during wafer processing. Further, it should be understood that selections made in each step, e.g., the concentration of various chemicals to use in forming an insulation film in step 1105, may be made based upon processing requirements.

At each stage of wafer processing, when preprocessing steps have been completed, post-processing steps may be implemented. During post-processing, initially, in step 1117, photoresist is applied to a wafer. Then, in step 1121, an exposure device may be used to transfer the circuit pattern of a reticle to a wafer. Transferring the circuit pattern of the reticle of the wafer generally includes scanning a reticle scanning stage which may, in one embodiment, include a force damper to dampen vibrations.

After the circuit pattern on a reticle is transferred to a wafer, the exposed wafer is developed in step 1125. Once the exposed wafer is developed, parts other than residual photoresist, e.g., the exposed material surface, may be removed by etching in step 1129. Finally, in step 1133, any unnecessary photoresist that remains after etching may be removed. As will be appreciated by those skilled in the art, multiple circuit patterns may be formed through the repetition of the preprocessing and post-processing steps.

Although only a few embodiments of the present invention have been described, it should be understood that the present invention may be embodied in many other specific forms without departing from the spirit or the scope of the present invention. By way of example, while a flatcoil planar motor has been described as being a 3-phase motor, a flatcoil planar motor is not limited to being a 3-phase motor. A flatcoil planar motor may instead be, for instance, a 2-phase or a 6-phase motor.

The size of coils of a flatcoil planar motor may generally vary widely depending upon the application for which the flatcoil planar motor is to be used. For instance, the size of a stage that is to be driven by a planar motor may be a significant factor in determining an overall size of a coil. Once a size of a coil is essentially determined, a suitable magnet pitch associated with a magnet array in a planar motor may then be determined. The magnet pitch may effectively be selected such that a desired amount of force may be generated by the planar motor, and such that the efficiency of the planar motor is at a desired level.

While a flatcoil planar motor or actuator may have a highest level of efficiency if a coil group has dimensions that are equal to the number of coils in the coil group multiplied by the overall width of a coil, the dimensions of a coil group may vary. For example, a coil group may be approximately square, and may have one dimension that is approximately equal to the number of coils in the coil group multiplied by the overall width of the coil, and another dimension that is slightly less than the number of coils in the coil group multiplied by the overall width of each coil. Alternatively, depending on the specific requirements, coil groups with a rectangular shape may be preferred.

As previously mentioned, coil groups are not limited to being substantially square in shape. In general, to achieve relatively dense packing of coils in a 3-phase planar motor, an overall coil length $C_L$ may be defined as being 3N times overall coil width $C_W$, where 'N' is an integer. For many applications, it may be preferable to have square coil groups, so 3N may equal a number of coils in each coil group. However, for rectangularly shaped coil groups, a group of three coils may be such that that overall coil length $C_L$ may be defined as being six times overall coil width $C_W$.

The operations associated with the various methods of the present invention may vary widely. By way of example, steps may be added, removed, altered, combined, and reordered without departing from the spirit or the scope of the present invention.

The many features of the present invention are apparent from the written description. Further, since numerous modifications and changes will readily occur to those skilled in the art, the invention should not be limited to the exact construction and operation as illustrated and described. Hence, all suitable modifications and equivalents may be resorted to as falling within the scope of the invention.

What is claimed is:

1. An electromagnetic actuator comprising:
   at least a first coil group, the first coil group including at least a first coil, the at least first coil having an elongated toroidal shape, the at least first coil having a first coil length and a first coil width, wherein the first coil length is approximately equal to a multiple of three times the first coil width;
   at least a second coil group, the second coil group including at least a second coil, the at least second coil having an elongated toroidal shape, the at least second coil having a second coil length and a second coil width, wherein the second coil length is approximately equal to a multiple of three times the second coil width, the at least second coil group being approximately adjacent to the at least first coil group; and
   a magnet array, the magnet array being configured to cooperate with the at least first coil group and the at least second coil group, the magnet array including a plurality of magnets, wherein the plurality of magnets has an associated magnet pitch, the first coil width and the second coil width being a function of the magnet pitch, wherein the at least second coil group is separated from the at least first coil group by a distance, the distance being measured between a side of the first coil and an end of the second coil.

2. The electromagnetic actuator of claim 1, wherein the first coil length is further defined by a first coil length range, the first coil length range having a top end and a bottom end for the first coil length.

3. An electromagnetic actuator comprising:
   at least a first coil group, the first coil group including at least a first coil, the at least first coil having an elongated toroidal shape, the at least first coil having a first coil length and a first coil width, wherein the first coil length is approximately equal to a multiple of three times the first coil width and wherein the first coil length is further defined by a range, the range having a top end and a bottom end for the first coil length;
   at least a second coil group, the second coil group including at least a second coil, the at least second coil having an elongated toroidal shape, the at least second coil having a second coil length and a second coil width, wherein the second coil length is approximately equal to a multiple of three times the second coil width, the at least second coil group being approximately adjacent to the at least first coil group; and
   a magnet array, the magnet array being configured to cooperate with the at least first coil group and the at least second coil group, the magnet array including a plurality of magnets, wherein the plurality of magnets has an associated magnet pitch, the first coil width and the second coil width being a function of the magnet pitch, wherein the top end of the range is below a value of L as defined by the equation $L=3/2(n+1)*Cw+Cb$, wherein,
   L is the length of the first coil;
   (n) is an integer multiple of three times the first coil width;
   Cw is the first coil width; and
   Cb is the first coil side width.

4. The electromagnetic actuator of claim 3, wherein the bottom end of the range is above a value of L as defined by the equation $L=3/2(n)*Cw+Cb$, where:
   L is the length of the first coil;
   (n) is an integer multiple of three times the first coil width;
   Cw is the first coil width; and
   Cb is the first coil side width.

5. The electromagnetic actuator of claim 1, wherein the second coil length is further defined by a second coil length range, the second coil length range having a top end and a bottom end for the second coil length.

6. An electromagnetic actuator comprising:
   at least a first coil group, the first coil group including at least a first coil, the at least first coil having an elongated toroidal shape, the at least first coil having a first coil length and a first coil width, wherein the first coil length is approximately equal to a multiple of three times the first coil width;
   at least a second coil group, the second coil group including at least a second coil, the at least second coil having an elongated toroidal shape, the at least second coil having a second coil length and a second coil width, wherein the second coil length is approximately equal to a multiple of three times the second coil width, the at least second coil group being approximately adjacent to the at least first coil group, wherein the second coil length is further defined by a range, the range having a top end and a bottom end for the second coil length; and
   a magnet array, the magnet array being configured to cooperate with the at least at least first coil group and the at least second coil group, the magnet array including a plurality of magnets, wherein the plurality of magnets has an associated magnet pitch, the first coil width and the second coil width being a function of the magnet pitch, wherein the top end of the range is below a value of L as defined by the equation $L=3/2(n+1)*Cw+Cb$, wherein,
   L is the length of the first coil;
   (n) is an integer multiple of three times the first coil width;
   Cw is the first coil width; and
   Cb is the first coil side width.

7. The electromagnetic actuator of claim 6, wherein the bottom end of the range is above a value of L as defined by the equation $L=3/2(n)*Cw+Cb$, where:
   L is the length of the first coil;
   (n) is an integer multiple of three times the first coil width;
   Cw is the first coil width; and Cb is the first coil side width.

8. The electromagnetic actuator of claim 1, wherein the first coil width and the second coil width are a 60 degree multiple of the magnet pitch, wherein the magnet pitch is measured in coil coordinates.

9. The electromagnetic actuator of claim 8, wherein the 60 degree multiple of the magnetic pitch consists of one of the following:
   (i) 60 degrees,
   (ii) 120 degrees,
   (iii) 120 degrees,
   (iv) 180 degrees,
   (v) 240 degrees,
   (vi) 300 degrees, or
   (vii) 360 degrees.

10. The electromagnetic actuator of claim 1 wherein the at least first coil has a first coil side width, the first coil side width being measured from an inner surface of the at least first coil to an outer surface of the at least first coil, the first coil side width being approximately equal to two fifths of the first coil width.

11. The electromagnetic actuator of claim 10 wherein the at least second coil has a second coil side width, the second coil side width being measured from an inner surface of the at least second coil to an outer surface of the at least second coil, the second coil side width being approximately equal to two fifths of the second coil width.

12. The electromagnetic actuator of claim 1 wherein the first coil group includes the first coil, a third coil, and a fourth coil, and the second coil group includes the second coil, a fifth coil, and a sixth coil.

13. The electromagnetic actuator of claim 1 wherein the first coil length is slightly less than three times the first coil width, and the second coil length is slightly less than three times the second coil width.

14. An electromagnetic actuator comprising:
    at least a first coil group, the first coil group including at least a first coil, the at least first coil having an elongated toroidal shape, the at least first coil having a first coil length and a first coil width, wherein the first coil length is slightly less than three times the first coil width;
    at least a second coil group, the second coil group including at least a second coil, the at least second coil having an elongated toroidal shape, the at least second coil having a second coil length and a second coil width, wherein the second coil length is slightly less than three times the second coil width, the at least second coil group being approximately adjacent to the at least first coil group; and
    a magnet array, the magnet array being configured to cooperate with the at least first coil group and the at least second coil group, the magnet array including a plurality of magnets, wherein the plurality of magnets has an associated magnet pitch, the first coil width and the second coil width being a function of the magnet pitch, wherein the second coil group is separated from the at least first coil group by a distance, the distance being measured between a side of the first coil and an end of the second coil, the distance being between approximately 5 millimeters and approximately 15 millimeters.

15. The electromagnetic actuator of claim 1 wherein the electromagnetic actuator is a three-phase planar motor.

16. The electromagnetic actuator of claim 1 wherein the first coil width is approximately equal to three hundred degrees measured in coil coordinates and the second coil width is approximately equal to three hundred degrees measured in the coil coordinates, wherein a north-to-north magnet pitch is defined as approximately 360 degrees measured in the coil coordinates.

17. The electromagnetic actuator of claim 1 wherein the first coil width is approximately equal to an integer multiple of sixty degrees and the second coil width is approximately equal to an integer multiple of sixty degrees, wherein a north-to-north magnet pitch is defined as approximately three hundred sixty degrees, wherein the degrees are measured in coil coordinates.

18. A stage apparatus comprising the electromagnetic actuator of claim 1.

19. An exposure apparatus comprising the stage apparatus of claim 18.

20. A wafer formed using the exposure apparatus of claim 19.

21. An apparatus comprising;
    a stage; and
    a planar motor, the planar motor being coupled to the stage and arranged to cause the stage to move, the planar motor including at least a first group and a second group, the first group and the second group having a shared set of axes, the axes including an x-axis and a y-axis, the planar motor further including a magnet array oriented at approximately forty-five degrees to the axes, wherein the first group includes at least a first coil having a first overall width and a first end-to-end coil length that is approximately equal to an integer multiple of three times the first overall width, and wherein the second group includes at least a second coil having a second overall width and a second end-to-end coil length that is approximately equal to an integer multiple of three times the second overall width, wherein the first end-to-end coil length is aligned along the x-axis and the second end-to-end coil length is aligned along the y-axis such that a side of the at least first coil is adjacent to an end of the at least second coil relative to a plane defined by the x-axis and the y-axis.

22. The apparatus of claim 21 wherein at least one of selected from a group including the first overall width and the second overall width are approximately 300 degrees measured in coil coordinates, and wherein a north-to-north magnet pitch is defined as approximately 360 degrees measured in the coil coordinates.

23. The apparatus of claim 21 wherein at least one selected from a group including the first overall width and the second overall width is equal to an integer multiple of approximately 60 degrees measured in coil coordinates, and wherein a north-to-north magnet pitch is defined as approximately 360 degrees measured in the coil coordinates.

24. The apparatus of claim 21 wherein the first coil has a first coil side width, the first coil side width being measured from an inner surface of the first coil to an outer surface of the first coil, the first coil width being approximately equal to two-fifths of the first overall width, and wherein the second coil has a second coil width, the second coil side width being measured from an inner surface of the second coil to an outer surface of the second coil, the second coil side width being approximately equal to two-fifths of the second overall width.

25. An exposure apparatus comprising the apparatus of claim 21.

26. A wafer formed using the exposure apparatus of claim 21.

27. A planar motor comprising:
    a first coil group, the first coil group including at least a first coil having an elongated toroidal shape, wherein the first coil further has a first coil length, a first overall coil width, and a first coil side width, the first coil length being approximately equal to an integer multiple of three times the first overall coil width, the first coil side width being approximately equal to two-fifths of the first overall coil width;

a second coil group, the second coil group including at least a second coil having the elongated toroidal shape, wherein the second coil further has a second coil length, a second overall coil width, and a second coil side width, the second coil length being approximately equal to an integer multiple of three times the second overall coil width, the second coil side width being approximately equal to two-fifths of the second overall coil width, the first coil group and the second coil group having a shared set of axes, wherein the first coil group is adjacent to the second coil group and the first coil group is spaced apart from the second coil group by a distance; and a magnet array, the magnet array being arranged to cooperate with the first coil group and the second coil group to generate at least one force, wherein the magnet array is oriented at approximately forty-five degrees to the shared set of axes.

28. The planar motor of claim 27 wherein at least one selected from the group including the first overall coil width and the second overall coil width is approximately 300 degrees measured in coil coordinates where a north-to-north magnet pitch is defined as approximately 360 degrees measured in the coil coordinates.

29. The planar motor of claim 27 wherein at least one selected from the group including the first overall coil width and the second overall coil width is approximately equal to an integer multiple of sixty degrees measured in coil coordinates where a north-to-north magnet pitch is defined as approximately 360 degrees measured in the coil coordinates.

30. The planar motor of claim 27 wherein the magnet array includes a plurality of magnets configured in a checkerboard pattern.

31. A stage apparatus comprising the planar motor of claim 27.

32. An exposure apparatus comprising the electromagnetic actuator of claim 31.

33. A wafer formed using the exposure apparatus of claim 32.

* * * * *